(12) United States Patent
Huang

(10) Patent No.: US 8,249,274 B2
(45) Date of Patent: Aug. 21, 2012

(54) AUDIO AMPLIFIER WITH TIMING CIRCUIT TO POWER DOWN BIAS CONTROL AND AMPLIFYING CIRCUITS IN SEQUENCE

(75) Inventor: Chih-Haur Huang, Fonghua Village (TW)

(73) Assignee: Himax Technologies Limited (TW)

( * ) Notice: Subject to any disclaimer, the term of this patent is extended or adjusted under 35 U.S.C. 154(b) by 1019 days.

(21) Appl. No.: 12/123,335

(22) Filed: May 19, 2008

(65) Prior Publication Data

US 2009/0284314 A1 Nov. 19, 2009

(51) Int. Cl.
*H04B 15/00* (2006.01)
(52) U.S. Cl. ...................................................... 381/94.5
(58) Field of Classification Search .................. 381/94.5
See application file for complete search history.

(56) References Cited

U.S. PATENT DOCUMENTS

| 5,642,074 | A | * | 6/1997 | Ghaffaripour et al. | ......... 330/51 |
| 5,898,340 | A | | 4/1999 | Chatterjee et al. | ............ 330/251 |
| 6,987,418 | B2 | * | 1/2006 | Kim et al. | ....................... 330/10 |

* cited by examiner

*Primary Examiner* — Howard Weiss
(74) *Attorney, Agent, or Firm* — Hayes Soloway P.C.

(57) ABSTRACT

An audio amplifier includes a timing control circuit, an amplifying circuit, and a bias control circuit. The timing control circuit generates a first power down signal and a second power down signal, in which the first power down signal is asserted before the second power down signal is asserted. The amplifying circuit receives a bias voltage to amplify an audio signal and is deactivated when the first power down signal is asserted. The bias control circuit provides the bias voltage for the amplifying circuit and is deactivated when the second power down signal is asserted.

8 Claims, 4 Drawing Sheets

AUDIO AMPLIFIER WITH TIMING CIRCUIT TO POWER DOWN BIAS CONTROL AND AMPLIFYING CIRCUITS IN SEQUENCE

BACKGROUND

1. Field of Invention

The present invention relates to a power amplifier. More particularly, the present invention relates to a power amplifier for amplifying an audio signal.

2. Description of Related Art

As the name suggests, an audio amplifier amplifies audio signals. These audio amplifiers typically include an audio input stage and an audio output stage. The audio input stage is connected to some type of audio source and the audio output stage is connected to the audio device such as a speaker. These audio amplifiers receive audio signals from the audio source, amplify those audio signals, generate audio current signals based on those amplified signals, and output the audio current signals to the speaker. The audio current signals drive the speaker and cause the speaker to reproduce the audio signals that are generated by the audio source to create sound.

To amplify the audio signal, the amplifying circuit of the audio amplifier typically requires a bias circuit to provide bias voltages to bias the amplifying circuit. However, when the audio amplifier just powers on, the power source, such as the supply voltage, is suddenly applied to the bias circuit. This causes the bias voltage generated by the bias circuit to vibrate a lot. As a result, the output audio signal generated according to the bias voltage vibrates as well. This might damage the audio amplifier and produce unpleasant pop noises.

Therefore, there is a need for a new audio amplifier which can prevent the pop noise, and prevent the amplifier circuit from being damaged when the audio power amplifier powers on or powers down.

SUMMARY

According to one embodiment of the present invention, an audio amplifier is disclosed. The audio amplifier includes a timing control circuit, an amplifying circuit, and a bias control circuit. The timing control circuit generates a first power down signal and a second power down signal, in which the first power down signal is asserted before the second power down signal is asserted. The amplifying circuit receives a bias voltage to amplify an audio signal and is deactivated when the first power down signal is asserted. The bias control circuit provides the bias voltage to the amplifying circuit and is deactivated when the second power down signal is asserted.

According to another embodiment, a method for reducing an explosion noise generated from an audio amplifier is disclosed. The method first powers off the amplifying circuit of the audio amplifier, in which the amplifying circuit amplifies the audio signal and then the audio amplifier bias control circuit is powered off after the amplifying circuit has been powered off, in which the bias control circuit provides at least one bias voltage to the amplifying circuit.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
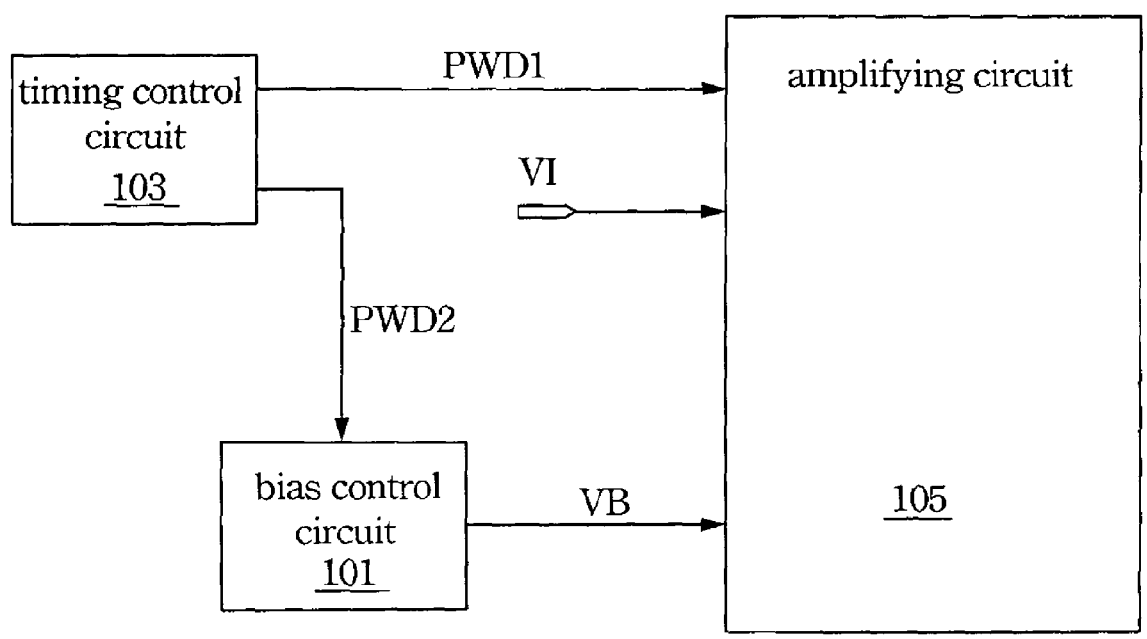
FIG. 1 shows the block diagram of the audio amplifier according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The timing control circuit of the audio amplifier in the following embodiment turns off the bias control circuit only when the amplifying circuit has been turned off previously, such that the bias voltage provided to the amplifying circuit doesn't vibrate when the audio amplifier is powered off. Therefore, the pop noise of the output audio signal can be eliminated.

FIG. 1 shows the block diagram of the audio amplifier according to one embodiment of the present invention. The audio amplifier includes a timing control circuit 103, an amplifying circuit 105, and a bias control circuit 101. The timing control circuit 103 generates a first power down signal PWD1 and a second power down signal PWD2, in which the first power down signal PWD1 is asserted before the second power down signal PWD2 is asserted. The amplifying circuit 105 receives a bias voltage VB, amplifies the audio signal VI, and is deactivated when the first power down signal PWD1 signal is asserted. The bias control circuit 101 provides the bias voltage VB for the amplifying circuit 105 and is deactivated when the second power down signal PWD2 is asserted.

Figure 2:
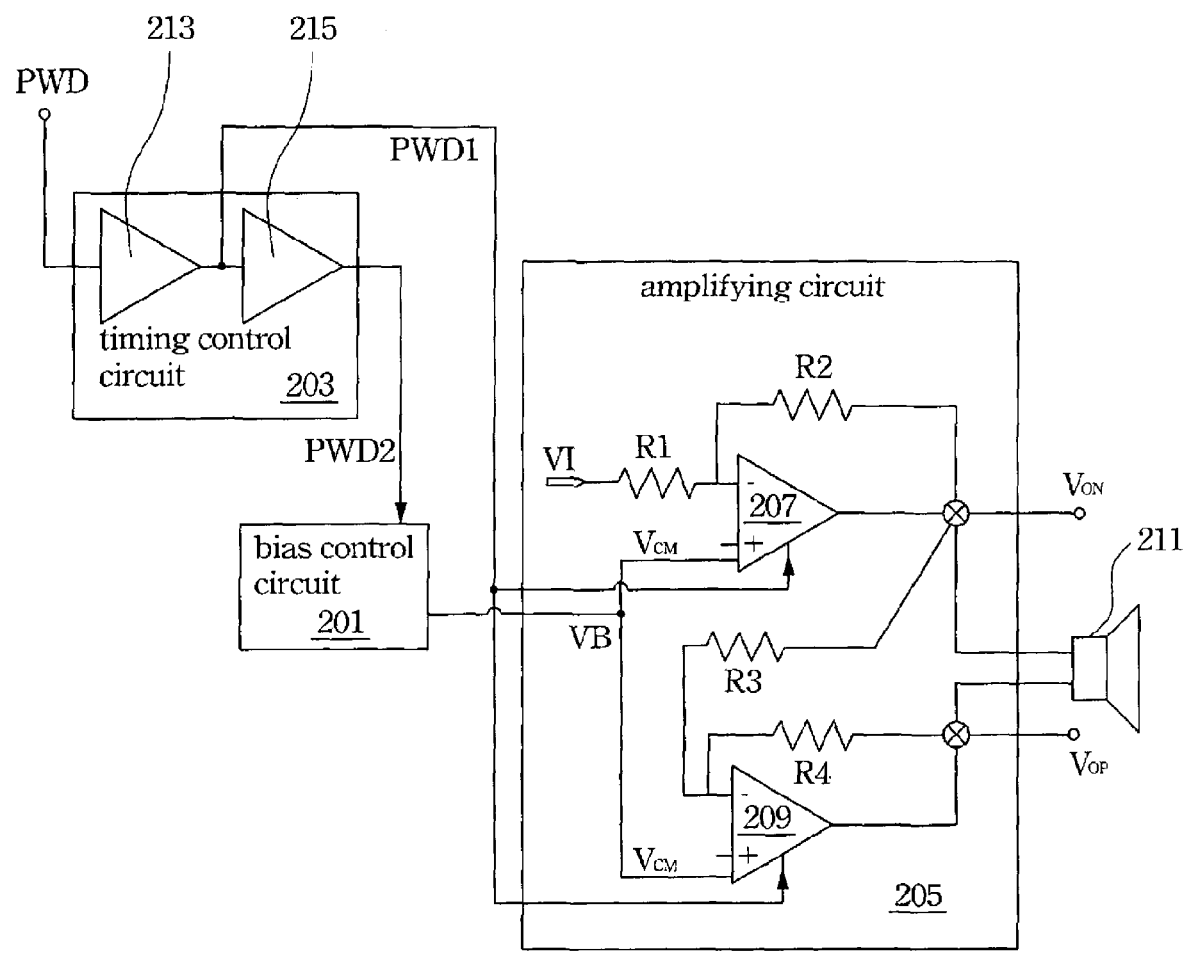
FIG. 2 shows the block diagram of the audio amplifier according to another embodiment of the present invention.

FIG. 2 shows the block diagram of the audio amplifier according to another embodiment of the present invention. The audio amplifier includes the timing control circuit 203, the amplifying circuit 205, and the bias control circuit 201. The amplifying circuit 205 receives a bias voltage VB to amplify the audio signal VI, and is deactivated when the first power down signal PWD1 is asserted. The common input voltage $V_{CM}$ inputted to the amplifying circuit 205 can be either the supply voltage or the ground voltage. The bias control circuit 201 provides the bias voltage VB for the amplifying circuit 205, and is deactivated when the second power down signal PWD2 is asserted.

The timing control circuit 203 generates the first power down signal PWD1 and the second power down signal PWD2. In this embodiment, the first power down signal PWD1 is generated by delaying the original power down signal PWD with the inverter 213, and the second power down signal PWD2 is generated by delaying the first power down signal PWD1 with the inverter 215. Therefore, the first power down signal PWD1 is asserted before the second power down signal PWD2 is asserted.

The amplifying circuit 205, amplifying the audio signal VI, includes a first operation amplifier 207 and a second operation amplifier 209. The first operation amplifier 207 has a first bias end for receiving the bias voltage VB. The first bias end is tied to a supply voltage or a ground voltage when the timing control circuit powers off the amplifying circuit. The first operation amplifier 207 generates the inverting output voltage Von according to the audio signal VI and the bias voltage VB.

The first operation amplifier 207 generates the inverting output voltage Von only when the first power down signal PWD1 is de-asserted and the bias control circuit 201 provides proper bias voltage VB.

The second operation amplifier 209 has a second bias end for receiving the bias voltage VB. The second bias end is tied to a supply voltage or a ground voltage when the timing control circuit powers off the amplifying circuit. The second operation amplifier 209 generates the non-inverting output voltage Vop according to the inverting output voltage Von and the bias voltage VB. The second operation amplifier 209 generates the inverting output voltage Vop only when the first power down signal PWD1 is de-asserted and the bias control circuit 201 provides proper bias voltage VB. The output voltage Vop and the output voltage Von drive the speaker 211 to reproduce the audio signal VI.

When the audio amplifier is just powered down, the bias control circuit 201 is powered down only after the amplifying circuit 205 has been powered down. Because the bias control circuit 201 still provides the proper bias voltage to the amplifying circuit 205 when the amplifying circuit 205 begins powering down, so the amplifying circuit 205 can still generate the inverting output voltage Von and the non-inverting output voltage Vop normally, and the pop noises of the output audio signal can be eliminated.

The first operation amplifier 207 and the second operation amplifier 209 can be class AB amplifiers, class B amplifiers, or class A amplifiers. The power transistors on the class A amplifier are in conductive states all the time, which means that the power transistors of the class A amplifier continuously dissipate power. Thereby, the class A amplifier has low power efficiency.

The power transistors on the class B amplifier are successively driven between conductive and non-conductive states, therefore, the power transistors of the class B amplifier operate only 50% of the time. The power transistors on the class AB amplifier are in the conductive states for time periods greater than one-half of the total period. Thereby, the power transistors of the Class AB amplifier are operated somewhere between 50% of the time and all of the time. As a result, because Class AB amplifier and Class B amplifier have better power efficiency, they are used more often in the audio amplifier than class A amplifier.

The amplifying circuit 205 further includes the first resistor R1, the second resistor R2, the third resistor R3, and the fourth resistor R4. The first resistor R1 has one end receiving the audio signal VI, and the other end connected to a negative terminal of the first operation amplifier 207. The second resistor R2 connected between the negative terminal and the output terminal of the first operation amplifier 207. The third resistor R3 has one end connected to the output terminal of the first operation amplifier 207 and the other end connected to a negative terminal of the second operation amplifier 209. The fourth resistor R4 connected between the negative terminal and the output terminal of the second operation amplifier 209. Tuning the resistance of the resistor R1\R2\R3\R4 changes the value of the voltage gain Von/VI and the voltage gain Vop/VI.

Figure 3:
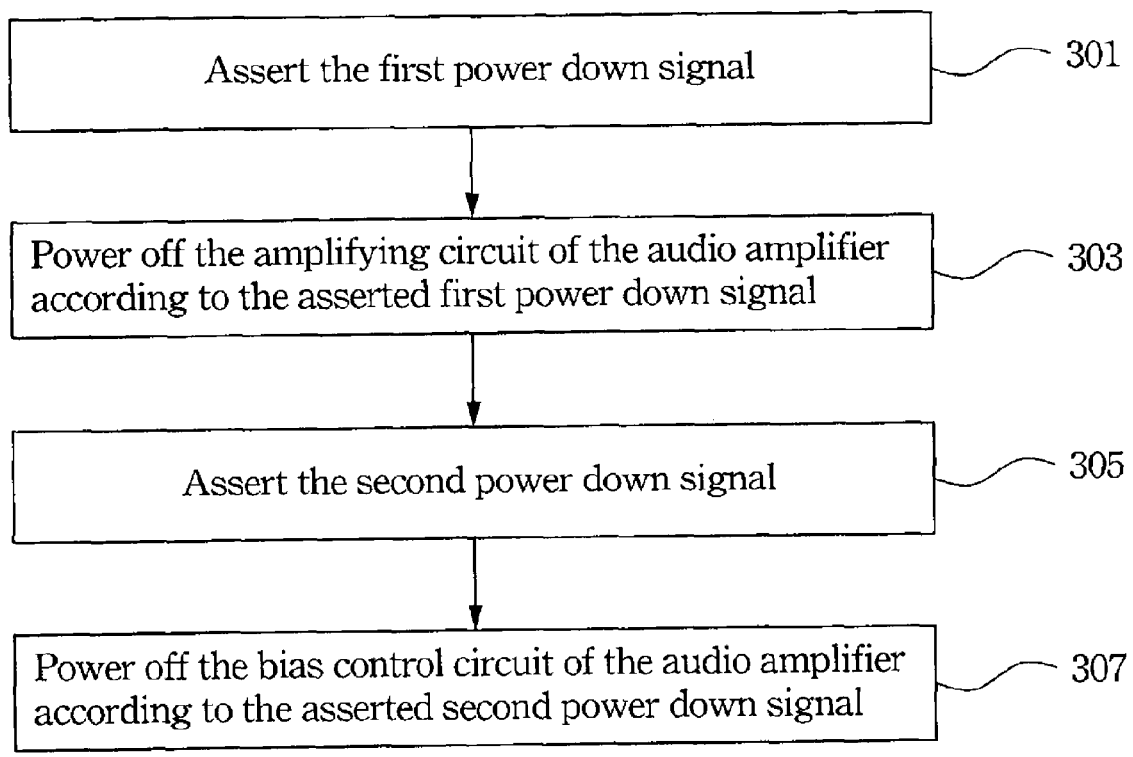
FIG. 3 shows the flow chart of method for playing an audio signal according to the embodiment of the present invention.

FIG. 3 shows the flow chart of method for playing an audio signal according to the embodiment of the present invention. The method reduces the explosion noise generated by the audio amplifier. The method asserts the first power down signal (step 301), and powers off the amplifying circuit of the audio amplifier according to the asserted first power down signal (step 303). The amplifying circuit can be powered off by passing a ground voltage or a supply voltage to the bias end of the amplifying circuit.

Then, the method asserts the second power down signal after the amplifying circuit has been powered off (step 305), and powers off the bias control circuit of the audio amplifier according to the asserted second power down signal (step 307), in which the bias control circuit provides at least one bias voltage for the amplifying circuit. Delaying the first power down signal with an inverter generates the second power down signal.

Figure 4:
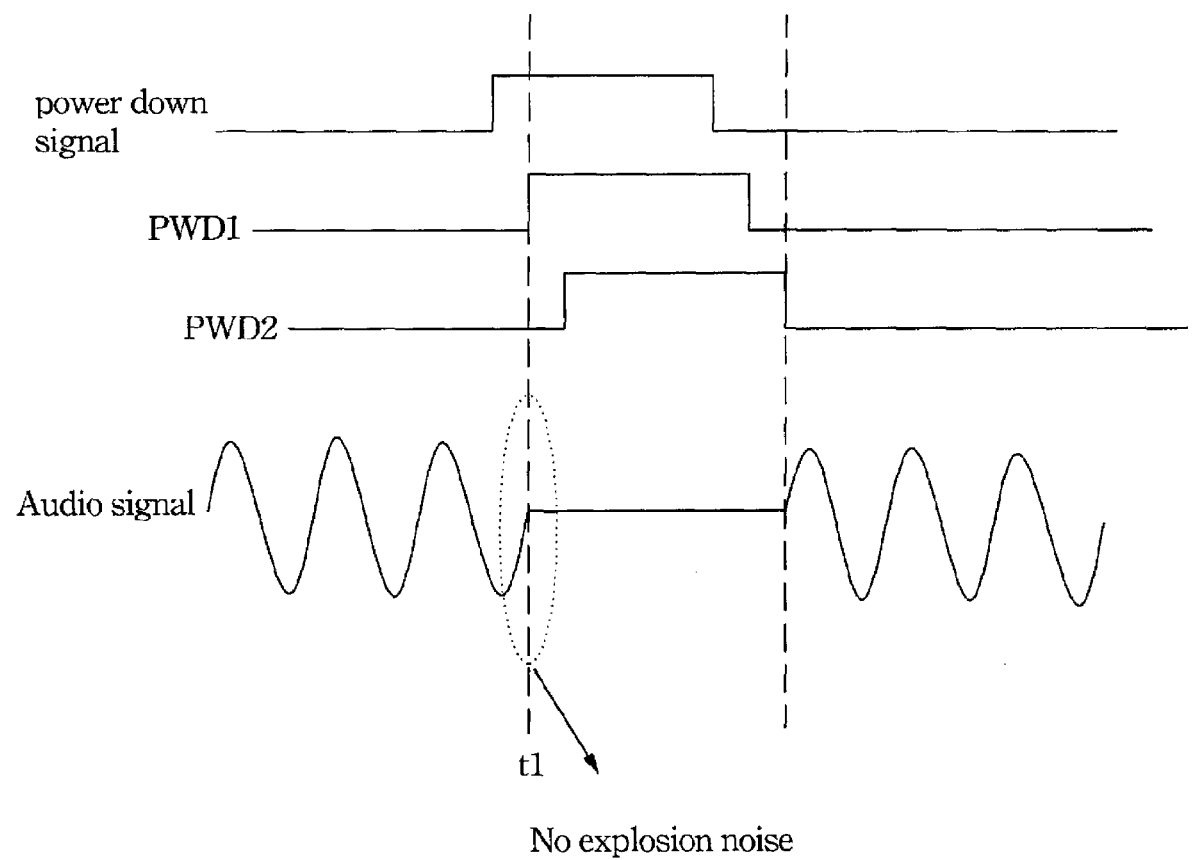
FIG. 4 shows the waveforms of the audio amplifier according to the embodiment of the present invention.

FIG. 4 shows the waveforms of the audio amplifier according to the embodiment of the present invention. According to the waveform, we can see that if the first power down signal PWD1 powers off the amplifying circuit before the second power down signal PWD2 powers off the bias control circuit, the explosion noises of the output audio signal is reduced at time t1 when the audio amplifier is powered down.

According to the above embodiments, the timing control circuit of the audio amplifier turns off the bias control circuit only when the amplifying circuit has been powered off previously, such that the bias voltage provided to the amplifying circuit doesn't vibrate when the audio amplifier is powered off. Therefore, the pop noise of the output audio signal can be eliminated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An audio amplifier, comprising:
a timing control circuit generating a first power down signal and a second power down signal;
an amplifying circuit coupling with the timing control circuit, wherein the amplifying circuit receives a bias voltage to amplify an audio signal and receives the first power down signal; and
a bias control circuit coupling with the timing control circuit and the amplifying circuit, wherein the bias control provides the bias voltage for the amplifying circuit and receives the second power down signal,
wherein the first power down signal is asserted before the second power down signal is asserted, and the amplifying circuit is deactivated when the first power down signal is asserted, and the bias control circuit is deactivated when the second power down signal is asserted.

2. The audio amplifier as claimed in claim 1, wherein the timing control circuit comprises:
a first inverter generating the first power down signal by delaying an original power down signal; and
a second inverter generating the second power down signal by delaying the first power down signal.

3. The audio amplifier as claimed in claim 1, wherein the amplifying circuit comprises:
a first operation amplifier having a first bias end for receiving the bias voltage, and generating an inverting output voltage according to the audio signal and the bias voltage; and
a second operation amplifier having a second bias end for receiving the bias voltage, and generating a non-inverting output voltage according to the inverting output voltage and the bias voltage,
wherein the first bias end and the second bias end are tied to a supply voltage or a ground voltage when the timing control circuit powers off the amplifying circuit.

4. The audio amplifier as claimed in claim 3, wherein the amplifying circuit further comprises:

a first resistor having one end receiving the audio signal and the other end connected to an negative terminal of the first operation amplifier; and a second resistor connected between the negative terminal and an output terminal of the first operation amplifier.

5. The audio amplifier as claimed in claim 4, wherein the amplifying circuit further comprises:

a third resistor having one end connected to the output terminal of the first operation amplifier and the other end connected to a negative terminal of the second operation amplifier; and a fourth resistor connected between the negative terminal and an output terminal of the second operation amplifier.

6. The audio amplifier as claimed in claim 3, wherein the first operation amplifier and the second operation amplifier are class AB amplifiers.

7. The audio amplifier as claimed in claim 3, wherein the first operation amplifier and the second operation amplifier are class B amplifiers.

8. The audio amplifier as claimed in claim 3, wherein the first operation amplifier and the second operation amplifier are class A amplifiers.

* * * * *